(12) United States Patent
Hyun

(10) Patent No.: US 7,615,451 B2
(45) Date of Patent: Nov. 10, 2009

(54) METHOD FOR FORMING SEMICONDUCTOR DEVICE

(75) Inventor: Yoon Suk Hyun, Seoul (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 139 days.

(21) Appl. No.: 11/819,852

(22) Filed: Jun. 29, 2007

(65) Prior Publication Data
US 2008/0102614 A1 May 1, 2008

(30) Foreign Application Priority Data
Oct. 27, 2006 (KR) .................. 10-2006-0104928

(51) Int. Cl.
*H01L 21/336* (2006.01)
(52) U.S. Cl. ............... 438/270; 438/259; 438/296; 438/589
(58) Field of Classification Search ............ 438/259, 438/270, 296, 589
See application file for complete search history.

(56) References Cited

U.S. PATENT DOCUMENTS

| | | | |
|---|---|---|---|
| 6,521,538 B2 * | 2/2003 | Soga et al. ............... 438/695 |
| 7,432,155 B2 * | 10/2008 | Park ............... 438/259 |
| 2006/0263991 A1 * | 11/2006 | Lee et al. ............... 438/296 |
| 2006/0289931 A1 * | 12/2006 | Kim et al. ............... 257/330 |
| 2007/0020861 A1 * | 1/2007 | Chong et al. ............... 438/296 |
| 2007/0148934 A1 * | 6/2007 | Cho et al. ............... 438/585 |

FOREIGN PATENT DOCUMENTS

| KR | 10-2005-0011376 A | 1/2005 |
|---|---|---|
| KR | 10-2006-0058959 A | 6/2006 |

\* cited by examiner

*Primary Examiner*—Charles D. Garber
*Assistant Examiner*—Bryan Junge
(74) *Attorney, Agent, or Firm*—IP & T Law Firm PLC

(57) ABSTRACT

A method for forming a semiconductor device is provided. More specifically, a method for forming a bulb-shaped portion of a bulb-shaped recess gate is provided to overcome an etching process margin reduction caused by a spacer oxide film formed on sidewalls of a recess and thickly laminated to a lower part of a recess. In one aspect, a buffer dielectric film pattern is formed additionally by a plasma enhanced chemical vapor deposition (PECVD) process over a hard mask pattern, so that a sufficient process margin used for forming the bulb-shaped portion is ensured and a process margin for forming a semiconductor device is increased.

7 Claims, 3 Drawing Sheets

METHOD FOR FORMING SEMICONDUCTOR DEVICE

The present application claims the benefit of priority to Korean patent application number 10-2006-0104928, filed on Oct. 27, 2006, the entire contents of which are incorporated herein by reference.

BACKGROUND

The present invention relates generally to a method for forming a semiconductor device, and more particularly, to a method for forming a bulb-shaped structure in a recess gate. The bulb-shaped recess is capable of preventing an etching process margin reduction that causes a spacer oxide film formed on sidewalls of a recess to thickly laminate over a lower part of the recess.

High integration trends for semiconductor devices have brought problems. These problems include a narrowed gate line width and a reduced channel length, which led to deterioration in electrical properties of the semiconductor devices. A recess gate technology has been introduced to resolve such disadvantages. The recess gate is obtained by etching a semiconductor substrate at an expected gate region to a designated thickness, thereby increasing a contact area between an active region and the recess gate to increase the channel length.

However, as the miniaturization of semiconductor devices continues, forming a recess in a very small semiconductor device has become a rather difficult task. To secure an effective area of a recess, the lower part of the recess therefore was formed in a globular shape. That is, a method for forming a bulb-shaped recess was developed to increase the effective area of a recess.

In order to form a bulb-shaped recess, first of all, a hard mask pattern exposing an expected gate region is formed over a semiconductor substrate. The semiconductor substrate is then etched using the hard mask pattern as an etching mask, so as to form a recess.

Next, a spacer dielectric layer is formed on an entire upper surface of the semiconductor substrate including the recess.

The spacer dielectric layer formed at a lower part of the recess is removed by an anisotropic etching process, so that the spacer dielectric layer may remain only on sidewalls of the recess.

With the hard mask pattern and the remaining spacer dielectric layer as a mask, the lower part of the semiconductor substrate is isotropically etched to form a bulb-shaped portion.

In this manner, a bulb-shaped recess with the bulb-shaped portion formed on the lower part of the recess is obtained. The channel length of a gate thus can be increased accordingly.

Then, the hard mask pattern and the spacer dielectric layer are removed, and a gate is formed over the bulb-shaped recess.

However, the problem with this method is that the spacer dielectric layer may not be evenly formed on the upper surface of the semiconductor substrate, but tends to be formed thickly on the lower part of the recess. Because of this, the spacer dielectric layer may remain in the lower part of the recess even though the spacer dielectric layer is subsequently anisotropically etched.

The residual spacer dielectric layer on the lower part of the recess may reduce the process margin for performing the isotropic etching process required for forming a subsequent bulb-shaped portion, and may disturb the formation of a normal bulb shape.

SUMMARY

In view of the foregoing, there is provided a method for forming a semiconductor device. More specifically, there is provided a method for forming a bulb-shaped portion of a bulb-shaped recess gate to overcome an etching process margin reduction caused by a spacer oxide film formed on sidewalls of a recess and thickly laminated to a lower part of the recess.

A method for forming a semiconductor device according to one embodiment consistent with the present invention includes: providing a semiconductor substrate; forming a device isolation film on the semiconductor substrate to define an active region; forming a hard mask pattern on the semiconductor substrate to define a gate region; etching the semiconductor substrate using the hard mask pattern as a mask to form a first recess; forming a spacer dielectric layer over the hard mask pattern and over the first recess; forming a buffer dielectric film pattern over the spacer dielectric layer without filling the first recess; forming a second recess by etching the spacer dielectric layer over a lower part of the first recess and the semiconductor substrate using the buffer dielectric film pattern as a mask; removing the buffer dielectric film pattern, the hard mask pattern, and the spacer dielectric layer; and forming a gate filling the first and the second recesses.

In one embodiment, an insulating layer may be formed additionally between the hard mask pattern and the semiconductor substrate, and the spacer dielectric layer may be formed by a Low Pressure Chemical Vapor Deposition (LPCVD) process. Moreover, the buffer dielectric film may be formed by a Plasma Enhanced Chemical Vapor Deposition (PECVD) process.

In one embodiment, forming the second recess includes anisotropically etching the spacer dielectric layer formed over the lower part of the first recess; and isotropically etching the semiconductor substrate that is exposed when the spacer dielectric layer is removed from the lower part of the first recess.

In one embodiment, the second recess is wider than the first recess and the first recess and the second recess define a bulb-shaped recess.

Accordingly, the semiconductor device forming method consistent with the present invention can be advantageously used to ensure a sufficient process margin for forming the bulb-shaped portion and to increase a process margin for the formation of a semiconductor device.

DETAILED DESCRIPTION

Hereinafter, embodiments consistent with the present invention will be set forth in detail with reference to the accompanying drawings, so that those skilled in the art can easily carry out the present invention.

FIGS. 1a through 1f are cross-sectional views showing a method for forming a semiconductor device, in accordance with one embodiment consistent with the present invention.

Figure 1A:
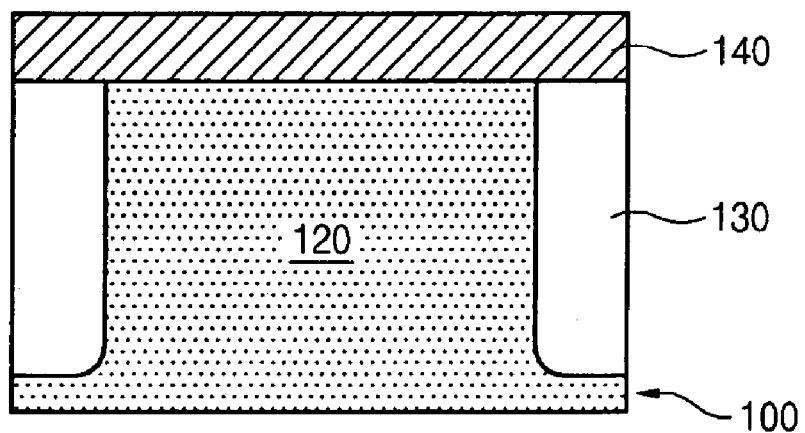
FIGS. 1a through 1f are cross-sectional views stepwisely showing a method for forming a semiconductor device, in accordance with one embodiment consistent with the present invention.

Referring to FIG. 1a, a semiconductor substrate 100 is provided. A device isolation film 130 defining an active region 120 is formed on semiconductor substrate 100. At this time, device isolation film 130 may be formed by a shallow trench isolation (STI) process. Active region 120 is then subjected to a channel ion implantation process. An insulating layer 140 is formed over semiconductor substrate 100. Insulating layer 140 may comprise a dielectric film.

Figure 1B:
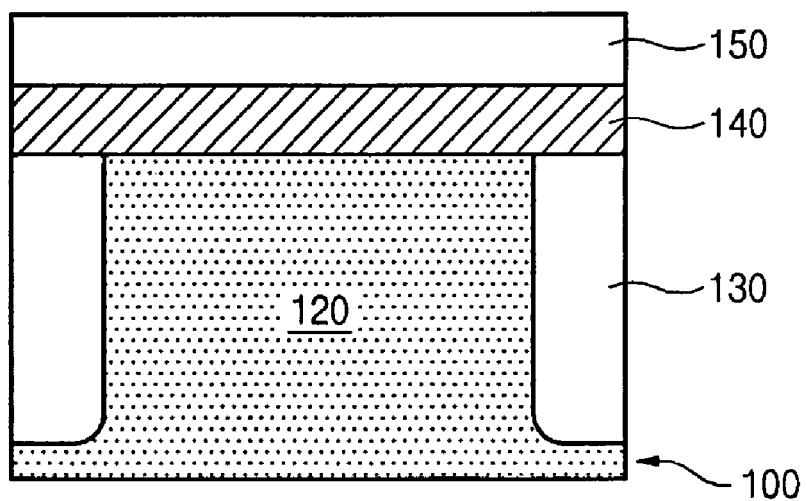

Referring to FIG. 1b, a hard mark layer 150 is formed over the insulating layer 140. Examples of a hard mask layer 150 may include a nitride film, a polysilicon layer, an amorphous carbon layer (a-C layer), and any combination of the above.

Insulating layer 140 is provided to protect semiconductor substrate 100 from being damaged during mask pattern and gate formation processes.

Figure 1C:
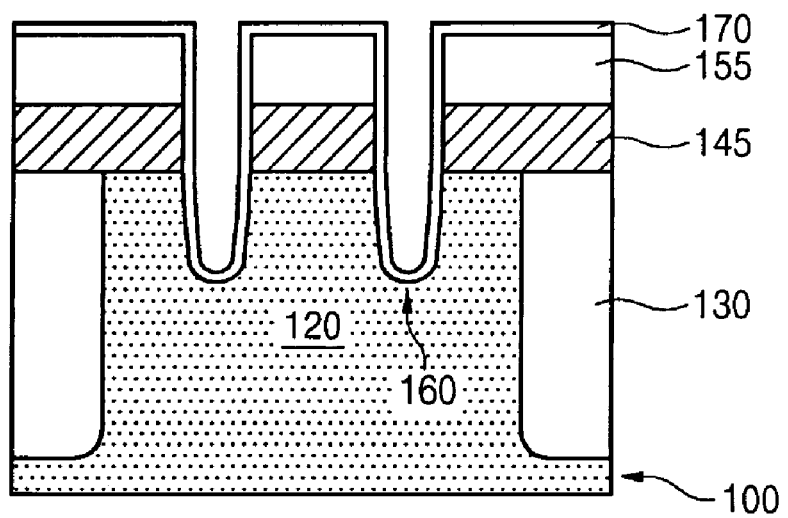

Referring to FIG. 1c, a photoresist pattern (not shown) exposing an expected gate region is formed over hard mask layer 150.

Using the photoresist pattern (not shown) as a mask, hard mask layer 150 is etched to form a hard mask pattern 155 exposing the expected gate region.

Using hard mask pattern 155 as a mask, insulating layer 140 and semiconductor substrate 100 are etched to form an insulating layer pattern 145 and a first recess 160.

Next, the photoresist pattern is removed, and a spacer dielectric layer 170 is formed on the entire upper surface of semiconductor substrate 100. At this time, spacer dielectric layer 170 may be formed by a low pressure chemical vapor deposition (LPCVD) process.

The LPCVD process may deposit materials, such as nitride, polysilicon, TEOS, and high temperature oxide (HTO), on a semiconductor substrate at a pressure of about 760 Torr or less. In order for spacer dielectric layer 170 to have a uniform thickness on surfaces of hard mask pattern 155 and the first recess 160, spacer dielectric layer 170 may be formed under a pressure of about 300 Torr to 400 Torr.

Figure 1D:
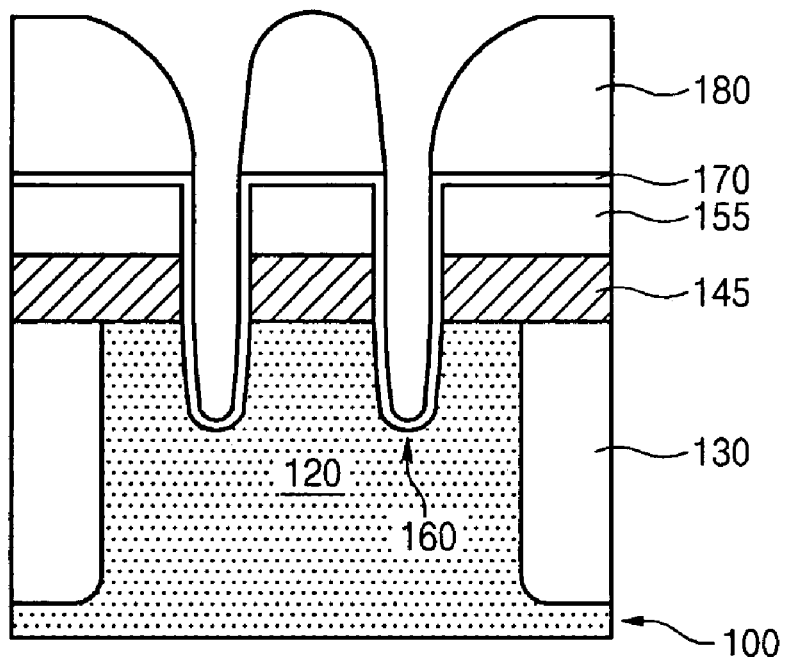

Referring to FIG. 1d, a buffer dielectric film pattern 180 is formed over spacer dielectric layer 170. In one embodiment, buffer dielectric film pattern 180 may be formed by a plasma enhanced chemical vapor deposition (PECVD) process.

The PECVD process activates a reactant using plasma excited by a high voltage. Because energy of the reactant is obtained by plasma, the PECVD process may be performed at a low temperature. However, a poor step coverage may deteriorate filling characteristics.

Therefore, buffer dielectric film pattern 180 is not filled inside the first recess 160, but is formed only over spacer dielectric layer 170 deposited on hard mask pattern 155.

Figure 1E:
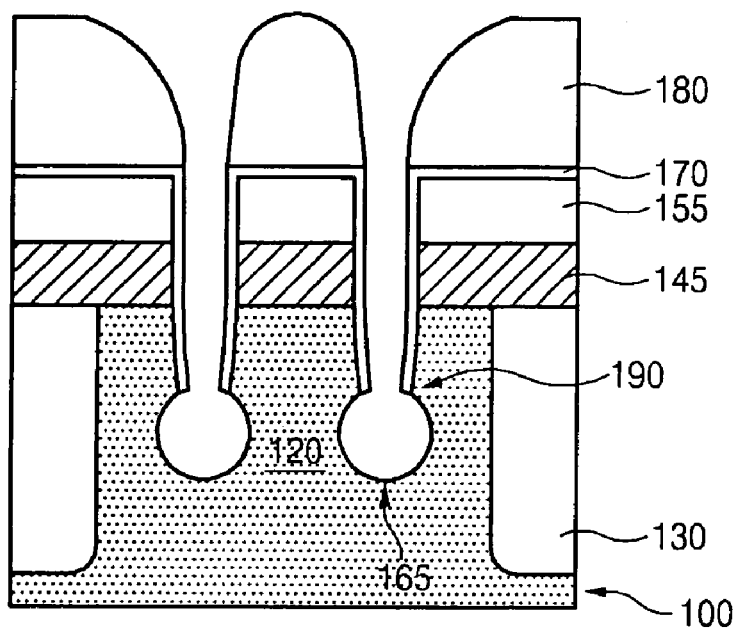

Referring to FIG. 1e, using buffer dielectric film pattern 180 as a mask, spacer dielectric layer 170 over the lower part of the first recess 160 and in semiconductor substrate 100 are etched to form a second recess 165. At this time, spacer dielectric layer 170 over the lower part of recess 160 is etched by an anisotropic etching process. Because buffer dielectric film pattern 180 is used as a mask pattern, even if spacer dielectric layer 170 may have been formed over the lower part of the first recess 160, it can be fully removed by performing an etching process for a sufficient amount of time. This aids in maintaining structural stability in the lower part of the first recess 160 when forming the second recess 165, by eliminating a subsequent isotropic etching process.

Under this procedure, the first recess 160 and the second recess 165 coupled to bulb-shaped recess 190 are formed.

Figure 1F:
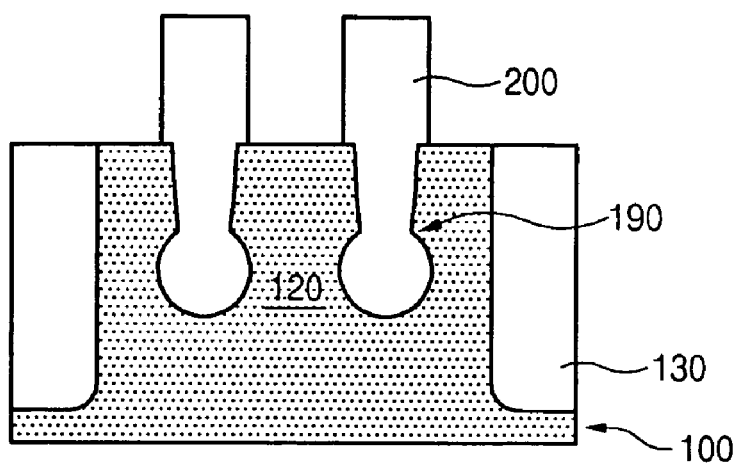

Referring to FIG. 1f, buffer dielectric film pattern 180, spacer dielectric layer 170, hard mask pattern 155, and insulating layer pattern 145 are removed, and a gate 200 is formed over semiconductor substrate 100 including bulb-shaped recess 190.

To form gate 200, in one embodiment, a gate dielectric layer (not shown) is formed on an entire surface of semiconductor substrate 100, and a gate polysilicon layer filling up bulb-shaped recess 190 is formed. Then, a gate metal layer and a gate hard mask layer are sequentially laminated to the upper part of the gate polysilicon layer, and are patterned. Because of bulb-shaped recess 190 is formed underneath gate 200, the resulting gate becomes a bulb-shaped recess gate.

As explained above, spacer dielectric layer 170 may be formed by a LPCVD process to have a substantially uniform thickness, so as to resolve the problems of a thick spacer dielectric layer formed over the lower part of the first recess 160. Moreover, buffer dielectric film pattern 180 may be formed by a PECVD process to increase the process margin used for forming the second recess 165. Because the step coverage of buffer dielectric film pattern 180 formed by the PECVD process tends to deteriorate, buffer dielectric film pattern 180 should be formed only over the hard mask pattern 155, so as to ensure a sufficient etching margin for forming the second recess 165.

Therefore, the method for forming a semiconductor device according to one embodiment consistent with the present invention may be used to improve the electrical characteristics and reliability of semiconductor devices.

The above embodiments consistent with the present invention are illustrative and not limitative. Various alternatives and equivalents are possible. The invention is not limited by the types of deposition, etching, polishing, and/or patterning steps described herein. Nor is the invention limited to any specific types of semiconductor devices. For example, the present invention may be implemented in a dynamic random access memory (DRAM) device, or in a non-volatile memory device. Other additions, subtractions, or modifications are obvious in view of the present disclosure and are intended to fall within the scope of the appended claims.

What is claimed is:

1. A method for forming a semiconductor device, comprising:
   providing a semiconductor substrate;
   forming a device isolation film on the semiconductor substrate to define an active region;
   forming a hard mask pattern on the semiconductor substrate to define a gate region;
   etching the semiconductor substrate using the hard mask pattern as a mask to form a first recess;
   forming a spacer dielectric layer over the hard mask pattern and over the first recess;
   forming a buffer dielectric film pattern over the spacer dielectric layer and not in the first recess;
   forming a second recess by etching the spacer dielectric layer over a lower part of the first recess and the semiconductor substrate using the buffer dielectric film pattern as a mask;
   removing the buffer dielectric film pattern, the hard mask pattern, and the spacer dielectric layer; and
   forming a gate filling the first and the second recesses.

2. The method of claim 1, further comprising:
   forming an insulating layer between the hard mask pattern and the semiconductor substrate.

3. The method of claim 1, wherein forming the spacer dielectric layer comprises performing a low pressure chemical vapor deposition process.

4. The method of claim 1, wherein forming the buffer dielectric film comprises performing a plasma enhanced chemical vapor deposition process.

5. The method of claim 1, wherein forming the second recess comprises:
   anisotropically etching the spacer dielectric layer formed over a lower part of the first recess; and isotropically etching a portion of the semiconductor substrate that is exposed when the spacer dielectric layer is removed from the lower part of the first recess.

6. The method of claim 1, wherein the second recess is wider than the first recess.

7. The method of claim 1, wherein the second recess defines a bulb-shaped recess.

* * * * *